United States Patent
Van Der Zanden

(10) Patent No.: US 7,948,014 B2
(45) Date of Patent: May 24, 2011

(54) ELECTRONIC DEVICE

(75) Inventor: Josephus Henricus Bartholomeus Van Der Zanden, Best (NL)

(73) Assignee: NXP B.V., Eindhoven (NL)

( * ) Notice: Subject to any disclaimer, the term of this patent is extended or adjusted under 35 U.S.C. 154(b) by 726 days.

(21) Appl. No.: 11/915,464

(22) PCT Filed: May 11, 2006

(86) PCT No.: PCT/IB2006/051484
§ 371 (c)(1),
(2), (4) Date: Nov. 26, 2007

(87) PCT Pub. No.: WO2006/126125
PCT Pub. Date: Nov. 30, 2006

(65) Prior Publication Data
US 2010/0252865 A1    Oct. 7, 2010

(30) Foreign Application Priority Data
May 26, 2005 (EP) .................................. 05104508

(51) Int. Cl.
*H01L 29/772* (2006.01)
(52) U.S. Cl. ............... 257/252; 257/428; 257/E31.113; 716/119
(58) Field of Classification Search ............... 257/252, 257/428, E31.113; 716/9, 119
See application file for complete search history.

(56) References Cited

U.S. PATENT DOCUMENTS
5,021,853 A   6/1991 Mistry
5,623,232 A   4/1997 Halbert et al.
(Continued)

FOREIGN PATENT DOCUMENTS
GB    2213320 A    8/1989

OTHER PUBLICATIONS

Su, J.-G; et al "New Insights on RF CMOS Stability Related to Bias, Scaling, and Temperature" Proceedings 2000 IEEE Hong Kong Electron Devices Meeting (CAT. No. 00TH8503) IEEE Piscataway, NJ, USA, 2000, pp. 40-43.

*Primary Examiner* — Allan R Wilson

(57) ABSTRACT

The invention relates to an electronic device having a semiconductor die comprising at least one RF-transistor (RFT) occupying a total RF-transistor active area (ARFT) on the die (DS). The total RF-transistor active area (ARFT) includes at least one transistor channel (C) having a channel width (W) and a channel length (L), and at least one bias cell (BC) for biasing the RF-transistor (RFT). The total bias cell active area (ABC) includes at least one transistor channel (C) having a channel width (W) and a channel length (L). The at least one bias cell (BC) occupies a total bias cell active area (ABC) on the die (SD). The total RF-transistor active area (ARFT) is substantially greater than the total bias cell active area (ABC). The total bias cell active area (ABC) has a common centre of area (COABC). The total RF-transistor active area (ARFT) has a common centre of area (COARF). The active areas (ABC, ARFT) are arranged such that both, the common centre of area or sub-areas of the RF-transistor (COARF) and the common centre of area or sub-areas of the bias cell (COABC) are positioned on an axis (AX2). The axis (AX2) is substantially perpendicular or parallel to the length (L) of the at least one channel (C) of the RF-transistor (RFT).

12 Claims, 14 Drawing Sheets

U.S. PATENT DOCUMENTS

| | | | |
|---|---|---|---|
| 6,018,270 A | 1/2000 | Stuebing et al. | |
| 6,285,865 B1 * | 9/2001 | Vorenkamp et al. | 455/307 |
| 6,426,680 B1 * | 7/2002 | Duncan et al. | 331/34 |
| 6,448,859 B2 | 9/2002 | Morizuka | |
| 6,661,290 B2 | 12/2003 | Sugiura | |
| 7,046,090 B2 * | 5/2006 | Veinblat | 330/285 |
| 7,665,054 B1 * | 2/2010 | Gopalakrishnan et al. | 716/8 |
| 2002/0097097 A1 | 7/2002 | Sugiura | |
| 2004/0222848 A1 * | 11/2004 | Shih et al. | 330/66 |
| 2006/0090146 A1 * | 4/2006 | LeBritton et al. | 716/4 |
| 2009/0273009 A1 * | 11/2009 | Cummins | 257/252 |
| 2010/0031215 A1 * | 2/2010 | Ramsour et al. | 716/9 |

* cited by examiner

ELECTRONIC DEVICE

The invention relates to an electronic device comprising a semiconductor die with at least one RF-transistor occupying a total RF-transistor active area on the die.

RF MM ICs (Radio Frequency Monolithic Microwave Integrated Circuits) and discrete transistors with integrated bias circuits require a bias circuit that keeps the quiescent current constant over a certain range of the ambient temperature. The characteristics (e.g. linearity) of an RF-transistor are very sensitive to the setting of the bias circuit. Often, the bias circuit is current driven, i.e. the current in the RF-transistor is determined by means of a current mirror. According to this principle, the bias transistor and the RF-transistor are coupled such that the current through the bias cell determines the current through the RF-transistor, i.e. the current through the bias transistor is "mirrored" into the RF-transistor. Current mirrors are well known in the art.

For MOSFETs (Metall Oxide Silicon Field Effect Transistors) the proportion of the currents through the bias transistor and the RF-transistor being arranged in a current mirror depend on the total effective finger length (width and length of the active areas (channel)) of the transistors. The characteristics of the RF-transistor including the current through the RF-transistor are predetermined by the application to which the RF MM IC is dedicated. To keep the power consumption small for the whole circuitry, the design parameters of the bias cell are defined in a manner to minimize the current through the bias cell. For this purpose, the bias cell has an active area that is smaller than the active area of the RF-transistor. Accordingly, the bias current is also smaller than the current through the RF-transistor.

The ratio between the bias current and the quiescent current of the RF-transistor should remain constant independent from the technology spread occurring at mass production. Since the area of the RF-transistor is chosen larger than the area of the bias cell, the RF-transistor profits from a better averaging effect due to the large area. The averaging effect for the bias cell is smaller or in the worst case not present at all. Therefore, the bias cell suffers from a substantially higher parameter spread. The parameter spread causes a significant variation of the quiescent current. Due to the high current ratio between the bias cell and the RF-transistor, the error in the bias cell current is directly conveyed to the RF-transistor current. Such an error can impair the characteristics of the RF MM IC.

A second problem, known in the art, is thermal coupling of transistors integrated on the same die. Depending on the mode of operation (e.g. class AB), some RF-transistors require high currents leading to a significant amount of output power causing heat that is conveyed through the substrate to the bias cell. These heating effects can be responsible for further degradation of the circuitry.

In order to overcome these problems, prior art solutions suggest to implement the bias cell separately from the RF-transistor, i.e. not on the same die (or substrate). According to this known solutions, the bias circuitry can be adjusted at any one time for the integrated RF-transistor. However, these circuits require tuning, they are more complex and production is more expensive than for fully integrated solutions.

US2002/6,448,859 relates to a high frequency power amplifier having a bipolar transistor. The description of the United States patent discloses a high frequency power amplifier that includes a plurality of transistor blocks with a bipolar transistor, wherein each of the transistor block includes a resistance connected to an emitter of the bipolar transistor, a reference voltage generation circuit for generating a reference voltage as a base bias of the bipolar transistor, and a bias generation circuit connected to a base of the bipolar transistor, the bias generation circuit generating a base bias voltage by converting the reference voltage.

U.S. Pat. No. 6,661,290 relates to a high frequency power amplifier with a particular bias circuitry.

U.S. Pat. No. 6,018,270 discloses a single bias block for a single or multiple low voltage RF-circuitry including one or more amplifiers and one or more single or double balanced mixers with compensation for temperature and integrated circuit process parameters.

U.S. Pat. No. 5,623,232 relates to a topography for integrated circuit operational amplifier having low impedance input for current feedback. A balanced, symmetrical topography is suggested to avoid degradation due to unbalanced thermal responses of thermally sensitive transistors to internal heat generation.

US2004/0222848 relates to a balanced radio frequency power amplifier with temperature compensation. A two transistor radio frequency power amplifier is disclosed which has generally symmetric bifurcated inputs and outputs which are configured so as to provide desired electrical balance and also a temperature compensation circuit configured to provide substantial uniform gain over a range of operating temperatures.

It is an object of the invention to provide an electronic device with reduced size and improved thermal stability. The object is solved by an electronic device according to claim 1.

Therefore, an electronic device is provided with a semiconductor die, which comprises at least one RF-transistor that occupies a total RF-transistor active area on the die. The total RF-transistor active area includes at least one transistor channel with a specific channel width and a specific channel length. At least one bias cell for biasing the RF-transistor is also arranged on the die, wherein the at least one bias cell occupies a total bias cell active area on the die. The bias cell can consist of one or more transistors. The total bias cell active area (ABC) includes at least one transistor channel having a specific channel width and a specific channel length. The total RF-transistor active area is substantially greater than the total bias cell active area. The total bias cell active area has a common centre of area. The total RF-transistor active area has a common centre of area as well. The active areas of the bias cell and the RF-transistor are arranged such that both, the common centre of area of the RF-transistor and the common centre of area of the bias cell are positioned on an axis, wherein the axis is substantially perpendicularly or parallel to the length of the at least one channel of the RF-transistor.

An electronic device according to the above mentioned arrangement allows to arrange the bias cell, usually one or more bias transistors, on the same die together with the RF-transistor although such an arrangement has been considered unpractical for the following reasons. In order to save power, the bias cell is usually a transistor with a much smaller active area than the active area of the RF-transistor. Therefore, the electronic properties and parameters of the RF-transistor and the bias transistor differ substantially. The smaller bias transistor undergoes much more parameter variations than the larger RF-transistor. As a consequence extra components are needed to automatically or manually adjust the current through the bias cell, which are typically implemented externally to the integrated circuit of the RF-transistor. Thus, the possibility to adjust the bias current or the bias voltage at any time when the circuitry is implemented is preserved.

In addition, the electronic device according to the invention compensates for the strong parameter variations by an arrangement, where the common centres of the RF-transistor area and the bias cell area coincide in at least on direction on the surface of the die. Such an arrangement can compensate for first order parameter gradients in one or more directions on the surface of the die. The arrangement may also be chosen according to parameter gradients of an higher order.

For a single active area, the common centre of area is the geometrical centre of the area itself. For two or more separate active areas, first, the centre of area of each separate part is determined. For multiple active areas, the common centre of area is determined, on account of the dimensions of the respective areas of all parts. Even if the smaller bias cell area is divided, an increase of the parameter spread of each sub-area is compensated by an appropriate arrangement of the common centres of areas. The easiest approach consists in dividing the total active area in equally sized active sub-areas. The proper arrangement may be carried out according to a principle of common centroid in order to compensate for first order parameter gradients. The common centroid principle takes account of the individual dimension of each area in a specific dimension. The larger the area expands in one direction, the higher is its account in this direction in a proportional manner. Therefore, it might be sufficient to arrange the common centres of area on an axis parallel or perpendicular to the length of the channel.

Another disadvantage that has prevented the skilled artisan from placing the bias cell and the RF-transistor on the same die is the risk of thermal coupling. The RF-requirements entail large currents through the RF-transistor causing a considerable heat in the RF-transistor. This heat being coupled to the bias cell additionally impairs the bias cell's parameters thereby degrading their performance. According to the invention, it is possible to distance the areas of the bias cell and the RF-transistor sufficiently remote from each other to decrease thermal coupling.

According to an aspect of the invention, at least one of the total RF-transistor active area and the total bias cell active area is divided in at least two active sub-areas. These sub-areas comprise a substantial part of the respective device. The arrangement of the common centres of area as explained above can be easier, if the areas are divided into sub-areas.

According to another aspect of the invention, the active are of the RF-transistor is divided into an even number of RF-transistor active sub-areas. According to this arrangement, thermal coupling and parameter variation compensation can be optimized more efficiently.

According to a further aspect of the invention, the bias cell active area is located between the RF-transistor active sub-areas, and the bias cell active area has half of the RF-transistor active sub-areas on opposite sides. Hence, it is easier to match the common centres of areas of the active areas of the RF-transistor and the bias cell.

According to an aspect of the invention the electronic device has an even number of bias cell active sub-areas. As for the RF-transistor active area, an even number of bias cell active areas eases the procedure of determining the correct positions of the sub-areas with respect to the common centres of area.

According to another aspect of the invention, the electronic device has four bias cell active sub-areas The RF-transistor active area has a rectangular shape. The four bias cell active areas are each arranged in the proximity of one of the four corners of the rectangular RF-transistor active area. According to this arrangement the common centres of area are matched easily and thermal coupling is concurrently minimized. The four parts of the bias cell active areas can be each arranged substantially in the region of one of the corners of the rectangular RF-transistor active area. This is an improved arrangement to decrease thermal coupling and still preserve a good compensation of parameter variations.

According to an aspect of the invention, the electronic device has two equally sized bias cell active sub-areas. The two parts of the bias cell active area are arranged symmetrically on opposite sides of the RF-transistor active area.

According to still a further aspect of the invention, the active areas or sub-areas are arranged such that both, the common centre of area or sub-areas of the RF-transistor and the common centre of area or sub-areas of the bias cell are located on an axis. The axis is substantially perpendicular to the length of the at least one channel of the RF-transistor. For a specific technology a parameter spread in one direction can prevail. Often, spread is dominated by small imperfections in the direction of the length of the channels. The properties of the channel are highly sensitive to imperfections in this direction. Parameters causing spread are for example the effective channel length, the gate oxide thickness, the doping profile (shadow effects), or the doping concentration and many more. In the direction perpendicular to the direction of the channel length, i.e. in direction of the channel width, the influence of imperfections is not equally strong. Under these circumstances, it can be sufficient to compensate only for parameter degradations in one direction on the surface of the die. If the common centres of area of the active areas of the RF-transistor and the bias cell are positioned on one axis that is oriented perpendicular to the length of the channel of the RF-transistor, most of the parameter spread is avoided.

According to another aspect of the invention, each of the RF-transistor active sub-areas comprises a plurality of channels. Additionally or alternatively, each of the bias cell active sub-areas comprises a plurality of channels. For this end, the finger length (width of the channel) is reduced. Accordingly, even if the overall channel length and channel width of a transistor (bias transistor or RF-transistor) are maintained, a higher number of channels (fingers) can be arrange side by side. The increasing number of channels (fingers) serves to improve the average effect of the parameter spread. If the number of fingers is increased, the finger length must be shortened, if the total active area should be maintained. Accordingly, also the finger length of the RF-transistor's channels can be reduced to improve the averaging effect.

These and other aspects of the invention are apparent from and will be elucidated with reference to the embodiments described hereinafter and with respect to the following figures.

FIG. 1 shows a simplified schematic of a bias cell and an RF-transistor,

FIG. 2 shows a typical distribution (e.g. Gaussian) of the ratio between the bias current and the quiescent current of the RF-transistor under manufacturing conditions, FIG. 3 shows typical parameter variations as a function of the location on the surface of a chip, FIG. 4 shows a typical prior art circuitry that is arranged off-chip, FIG. 5 shows a conventional arrangement of an RF-transistor and a bias cell on a die, FIG. 6 shows an improved bias cell and RF-transistor arrangement according to an embodiment, where the centres of area coincide on one symmetrical axes, FIG. 7 shows an improved further bias cell and RF-transistor arrangement according to an embodiment, where the centres of area coincide on one symmetrical axes, FIG. 8 shows an ideal bias cell position according to an embodiment, FIG. 9 shows an arrangement, where the bias cell is split in two parts for less thermal coupling according to an embodiment, FIG. 10 shows another arrangement wherein the bias transistor is split in four parts for low thermal coupling according to an embodiment, FIG. 11 shows another bias cell position for an arrangement where the RF-transistor is split in four parts according to an embodiment, FIG. 12 shows an arrangement where the RF-transistor is split in four parts and the bias cell is split in two parts according to an embodiment, FIG. 13 shows an arrangement of a bias cell split in four parts and an RF-transistor split in four parts for extremely low thermal coupling according to an embodiment, FIG. 14 shows a simplified diagram of a MOSFET, FIG. 15 shows a simplified diagram of a MOSFET having multiple gates, FIG. 16 shows a simplified arrangement of an RF-transistor and a bias cell, both having multiple gates according to an embodiment, FIG. 17 shows an another arrangement of an RF-transistor and a bias cell according to an embodiment, FIG. 18 shows an arrangement of the RF-transistor and a bias cell according to an embodiment, and FIG. 19 shows an arrangement of the RF-transistor and a bias cell according to an embodiment.

FIG. 1 shows a simplified schematic circuit diagram of a bias cell BC and an RF-transistor RFT. A current source CS supplies a current IB to the bias cell BC. The RF-transistor RFT and the bias cell BC are coupled in a conventional current mirror manner. Accordingly, the current IB flowing through the bias cell BC is "mirrored" to the RF-transistor RFT. For MOSFET-transistors (Metal Oxide Silicon Field Effect Transistor) the ratio between the current IB and the current IDQ through the RF-transistor RFT is determined by typical design parameters as the width W and the length L of a transistor. The design parameters for the RF-transistor RFT are mainly predetermined by the application to which the transistor is dedicated. The design parameters, i.e. the width W and the length L of the bias cell BC are determined according to different needs.

As power consumption is one of the main concerns with respect to integrated circuits, it is desirable to have just a small bias current IB through the bias cell BC. Consequently, it is necessary to design just a small active area of the bias cell ABC. Although it is generally desirable to have small integrated circuits, occupying just a little part of a die (microchip), small areas entail also disadvantages. One of the main problems with respect to small areas is the parameter spread or the technological parameter variation.

FIG. 2 shows a diagram of the ratio between the bias current and the quiescent current of the RF-transistor. Under typical manufacturing conditions the parameter variations are anticipated to have Gaussian or normal distributions. Such distributions are known in the art. The smaller the area occupied by the bias cell ABC relative to the area occupied by the RF-transistor RFTA, the larger the spread, i.e. the broader and the more the Gaussian distribution.

FIG. 3 depicts typical models for parameter variations as a function of the location on a silicon die. The upper diagram shows three possibilities of the manner in which a certain parameter may vary along a first axis AX1. Curve (a) is the ideal flat distribution with no spread. Curve (b) corresponds to a linear (first order) gradient, which is the most common approximation for the type of variations. Curve (c) may represent some other kinds of variations, be it linear or even non-linear. Below the three curves, FIG. 3 shows a diagram of a rectangular area representative of an active area of a transistor having the width W and the length L on a silicon die. The active area provides the channel C of the transistor. An isolated gate is situated above the channel to control the current flow through the channel. The minimum length L of the channel is one of the main characteristics of a MOS technology. The first axis AX1 is substantially parallel to the width W of the channel C. According to the present invention, the parameter distribution is assumed to follow curve (b). Accordingly, an area of the die being closer to the left, provides different parameters than an area closer to the right. Components that occupy a large area on the die profit from an averaging effect of the shown parameter variations, while small areas are subject to a stronger parameter spread.

FIG. 4 shows a typical prior art circuitry (AN 1987) where the bias transistors Q1 and Q2 for biasing the RF-transistor RFT are arranged externally to the integrated circuit (die), on which the RF-transistor is implemented. It is an aspect of the present invention to integrate the bias transistors (bias cell) together with the RF-transistor on one die.

FIG. 5 shows an arrangement of an RF-transistor RFT in the bias cell BC. The RF-transistor RFT occupies an area on the die ARFT and the bias cell an area ABC that is significantly smaller than the area occupied by the RF-transistor ARFT. Since the area occupied by the RF-transistor ARFT is larger than the bias cell area ABC, the spread within the RF-transistor is averaged to a higher degree than the spread within the smaller bias cell area ABC. The single and small bias cell will not profit from the same averaging effect and is subject to more parameter deviation than the RF-transistor. However, the larger variations of bias cell parameters influence the ratio between the quiescent current IB and the bias current IDQ through the RF-transistor. This is the case for an arrangement as shown in FIG. 5, where the active areas of the RF-transistor ARFT and the bias cell ABC arranged side by side on the die. The common centre of area of the active area of the RF-transistor COARF does not coincide with the common centre of area of the bias cell COABC.

FIG. 6 shows a simplified schematic of an arrangement according to the invention, where the total active area of the bias cell ABC and the total active area of the RF-transistor ARFT are arranged such that, the centre of area of the bias cell COABC and the centre of area of the RF-transistor COARFT are located on one axes AX2. If parameter spread is dominated by effects only in one direction on the surface of the chip, the arrangement according to FIG. 6 would be sufficient to compensate for parameter variations in the one direction. Therefore, it is not necessary to match the centres of area completely, but to place them on one common axis AX2, being for example a common symmetrical axis of both active areas ARFT and ABC.

FIG. 7 shows a simplified diagram, where the active area of the bias cell ABC is split in two major parts ABC1 and ABC2. These two sub-areas ABC1, ABC2 have a common centre of area COABC lying on the axis AX2. The active area of the RF-transistor ARFT has a common centre of area COARFT lying on the axis AX2, too. Accordingly, the arrangement shown in FIG. 6, that compensates for parameter variations in one direction is also appropriate for designs, where one or both active areas ARFT, ABC are divided in sub-areas. This arrangement compensates already for spread in the direction perpendicular to AX2 and is sufficient if the direction predominates the spread.

FIG. 8 shows a simplified diagram of an ideal bias cell position ABC with respect to the equally sized active sub-areas of the RF-transistor ARFT 1, ARFT 2. In this particular arrangement the active area of the RF-transistor is divided into two major parts, such that the active area of the bias cell ABC can be placed in the middle of the two parts. When the arrangement of the areas and sub-areas is symmetrical with respect to the dashed line in the middle of FIG. 8, the bias cell BC represented by its area ABC benefits from this position. Further, the common centre of area of the active sub-areas ARFT1, ARFT2 of the RF-transistor COARF coincides with the common centre of area of the bias cell COABC. A position in the middle of the RF-transistor RFT is particularly advantageous, if a linear model for the parameter variation is assumed (according to curve (b) in FIG. 3). However, such an arrangement suffers from significant thermal coupling.

FIG. 9 shows another simplified schematic of an arrangement according to the present invention, where the area of the bias cell ABC is split in two parts ABC1, ABC2 for less thermal coupling. The thermal coupling can be controlled by changing the distance d1, d2 between ABC1, ABC2 and RFT. The two active sub-areas ABC1, ABC2 are positioned at opposite sides of the active area of the RF-transistor ARFT. It is also desirable to establish perfect symmetry with respect to the dashed middle line in FIG. 9. Special care is to be taken to match the common centres of area of the RF-transistor COARF and the bias cell COABC.

FIG. 10 shows a further arrangement, where the active area of the bias transistor ABC is split in four parts ABC1, ABC2, ABC3, ABC4. These four active sub-areas ABC1, ABC2, ABC3, ABC4 are to be distributed in a symmetrical manner around the active area of the RF-transistor ARFT. Such an arrangement is useful, if the thermal coupling between the bias cell BC in the centre of the RF-transistor or in the proximity of the RF-transistor is too strong. By increasing the distance d2 between the active area of the RF-transistor ARFT and the sub-areas ABC1 to ABC4, the thermal coupling can be reduced. With respect to the arrangement in FIG. 8, FIG. 9, the arrangement of FIG. 10 allows for less thermal coupling. As for the other arrangements, the common centres of areas and sub-areas of the RF-transistor COARF and the bias cell COABC should be matched.

FIG. 11 shows an arrangement according to the invention where the active area of the RF-transistor ARFT is split into multiple parts, in this case four parts ARFT1, ARFT2, ARFT3, ARFT4. The active area of the bias cell ABC is in the ideal position for this kind of paralleled RF-transistor active sub-areas. The common centres of areas and sub-areas of the RF-transistor COARF and the bias cell COABC coincide.

Figure 14:
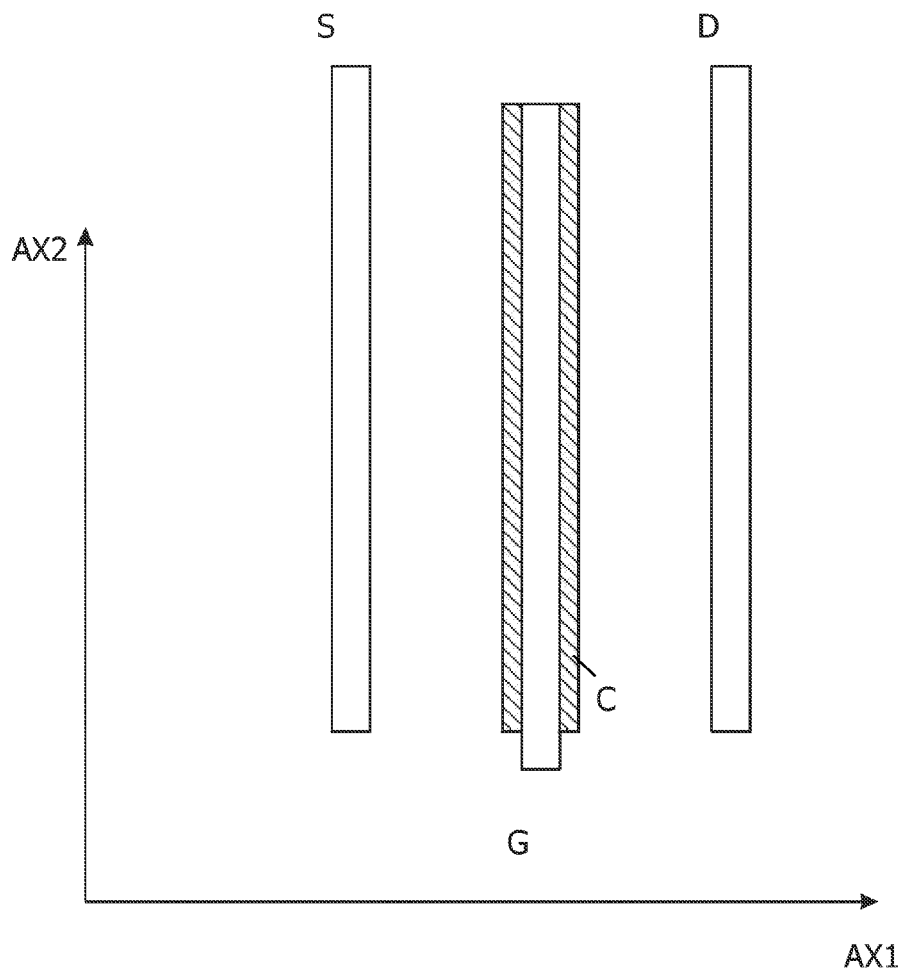

FIG. 14 shows a simplified diagram of a MOSFET which is well known in the art. The gate G covers the channel C (active area). The gate G controls the transistor's operation. Drain and source areas S, D are on the left and right sides of the gate G, respectively. The effective channel length L is one of the most important characteristics of the technology used to manufacture the transistor. The channel length L runs parallel to the axis AX1, the channel width W follows axis AX2. The channel width W is often greater than the channel length L to allow large currents. Due to their characteristic shape, the gate areas (and consequently the channels) are called fingers. So, the width W of the channel is then referenced by "finger length".

Figure 15:
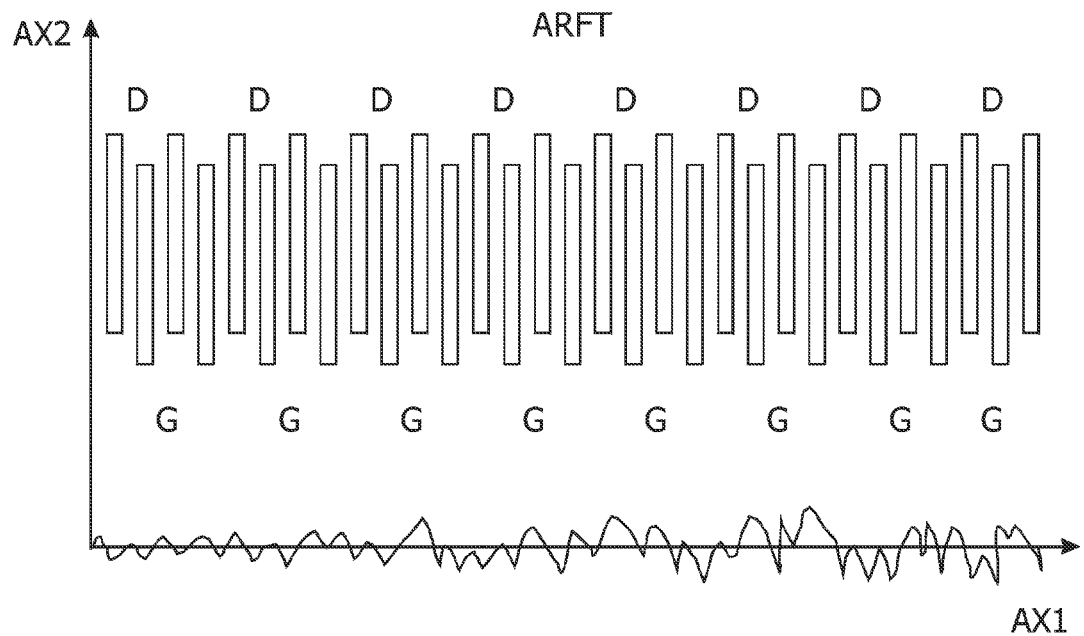

FIG. 15 shows another simplified diagram of a MOSFET. Typically, MOSFETs are split in a number of gates G and respective channels C (not shown), each being enclosed by drain and source areas (only D indicated for drains for simplicity). The gates, drains and sources are represented by the numerous rectangular areas lying side by side in FIG. 15. These rectangular areas are coupled together to form the MOSFET RFT or a pair of MOSFETs RFT to be matched. The wires for coupling the distinct drains, sources and gates are omitted in FIG. 15. FIG. 15 shows an exemplary parameter variation in the direction AX1 in form of an unsteady line below the transistor area ARFT. As there is a plurality of gates G (and corresponding channels C not shown) lying side by side in direction of the axis AX1, the parameter spread for the active area of the MOSFET is averaged in the AX1 direction.

Figure 16:
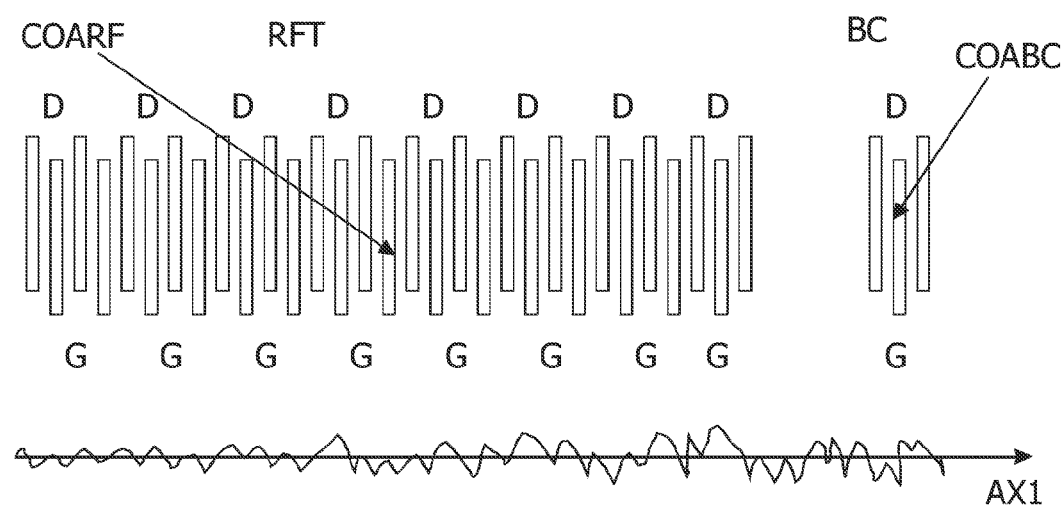

FIG. 16 shows a simplified diagram of an RF-transistor RFT and a bias cell BC. The RF-transistor RFT has a much larger active area. Therefore, the RF-transistor active area provides more gates G. The bias cell BC having a smaller active area provides only one single gate G. Consequently, the RF-transistor RFT benefits from a much better averaging effect of the indicated parameter spread in the AX1 direction than the bias cell BC. However, also the RF-transistor would profit from a reduced channel length (finger length) if an improved averaging effect is required.

Figure 1:
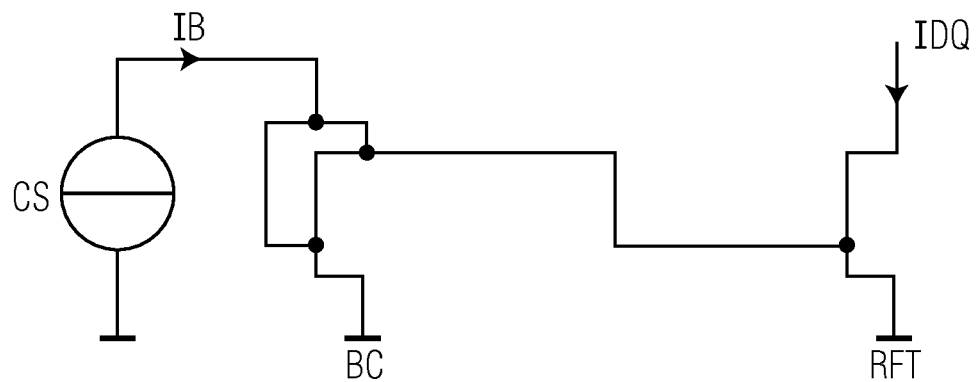
Figure 2:
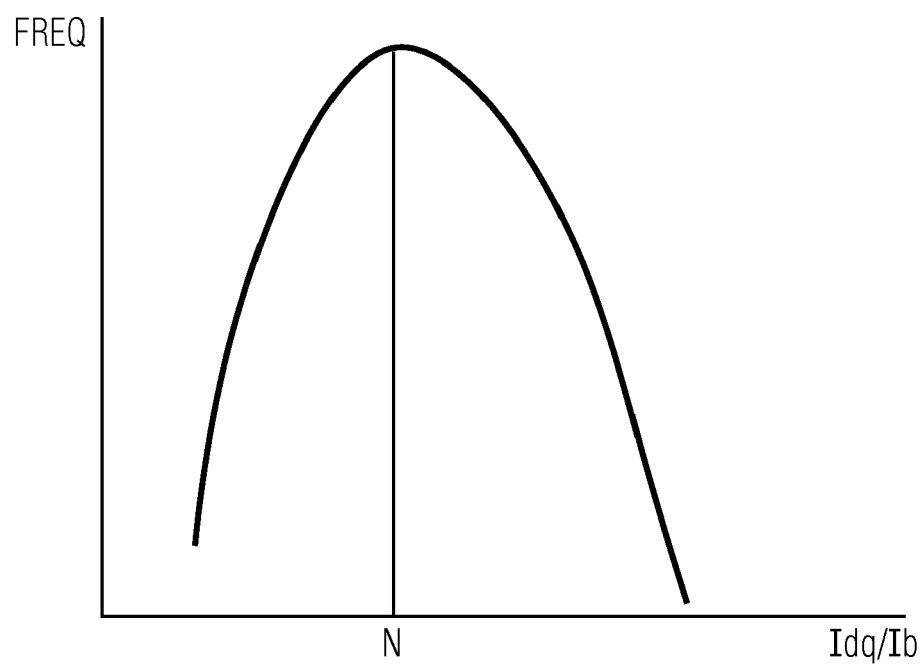
Figure 3:
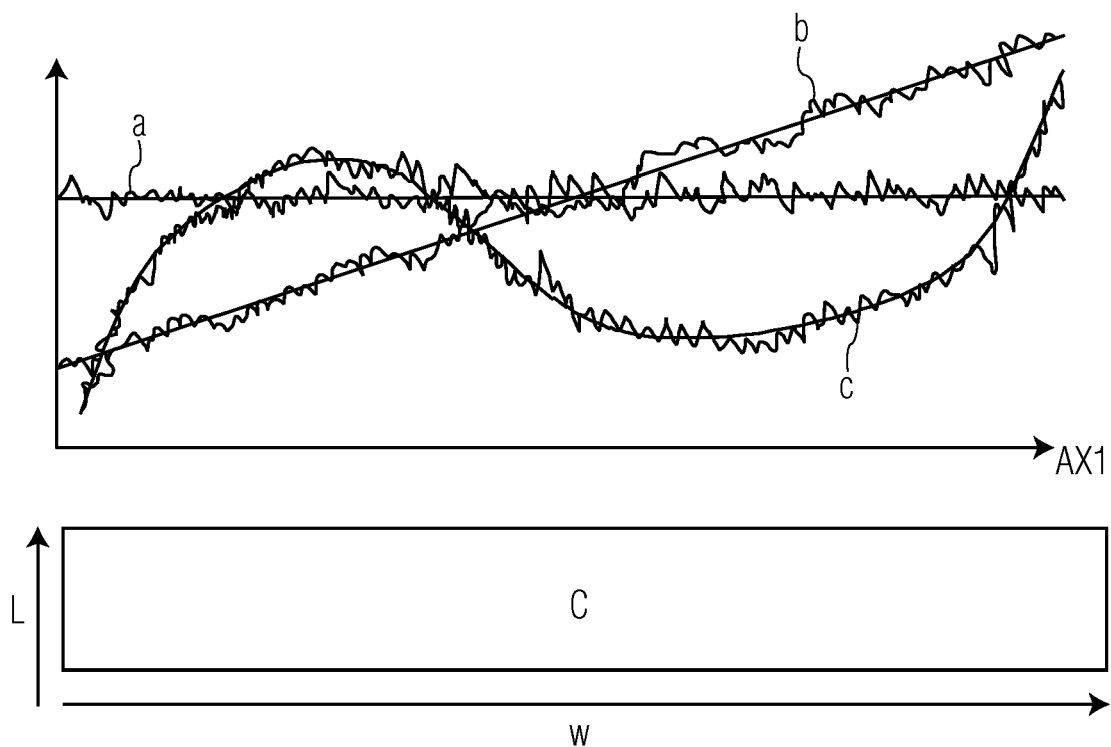
Figure 4:
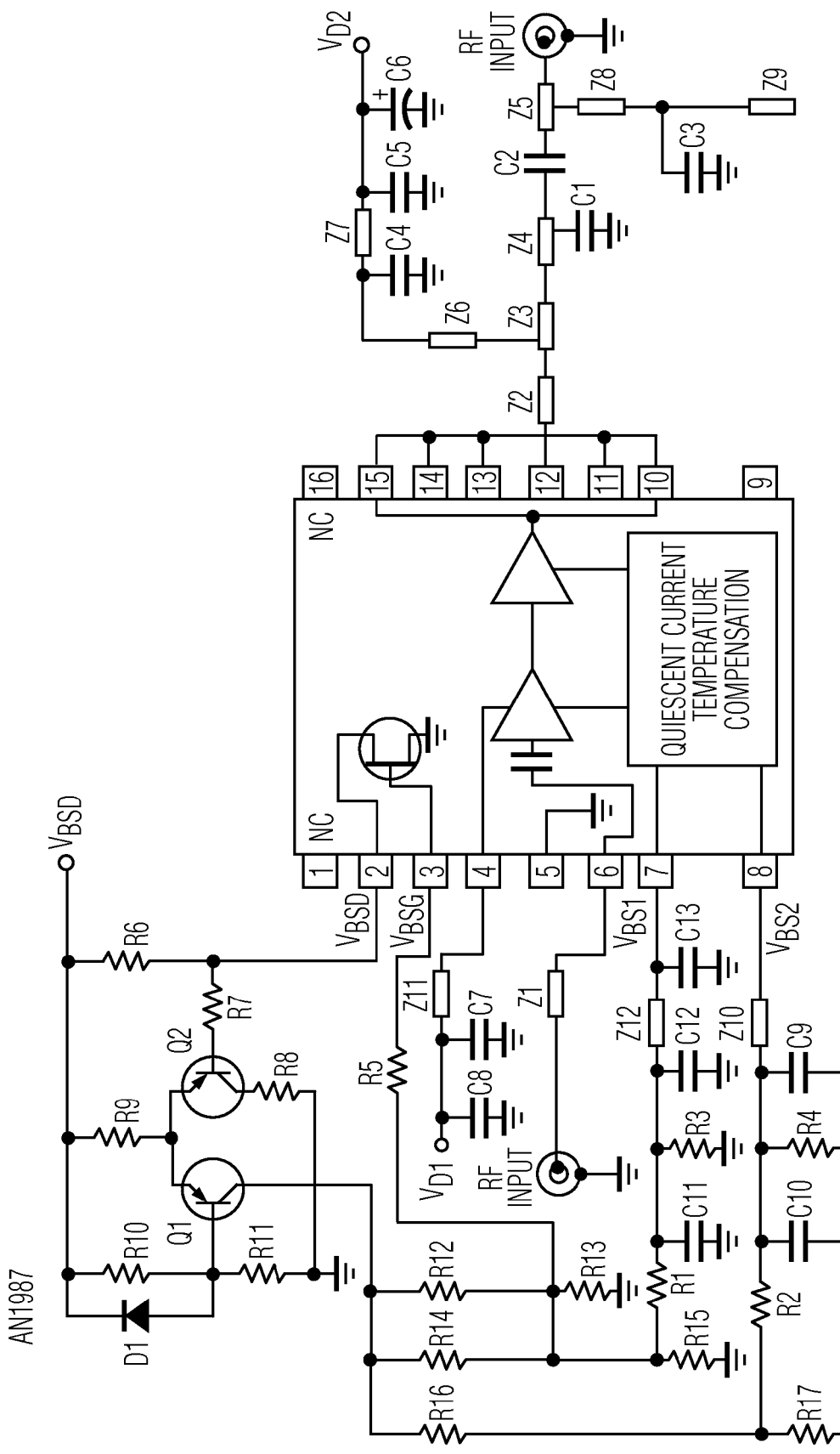
Figure 5:
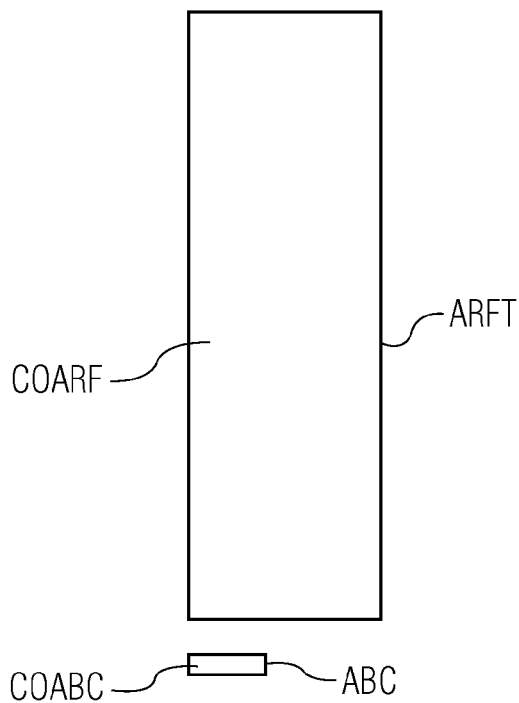
Figure 6:
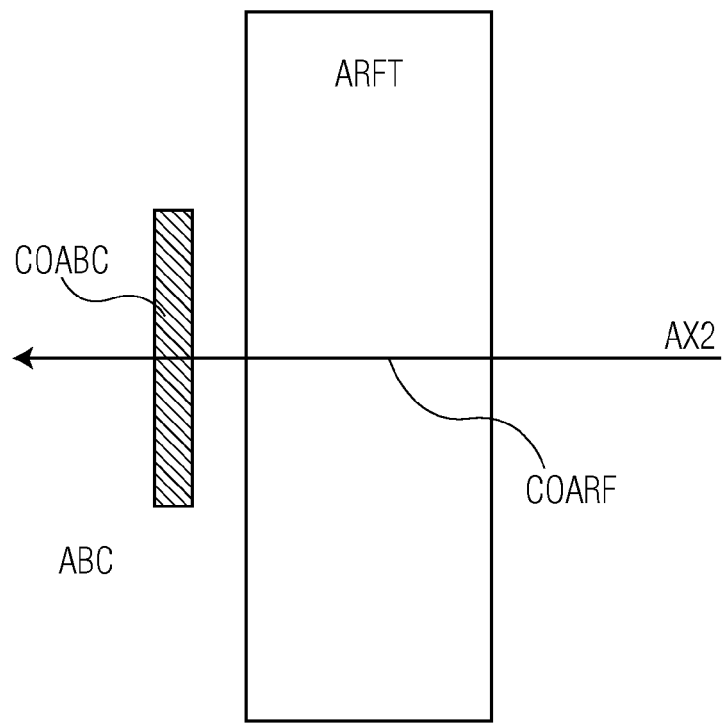
Figure 7:
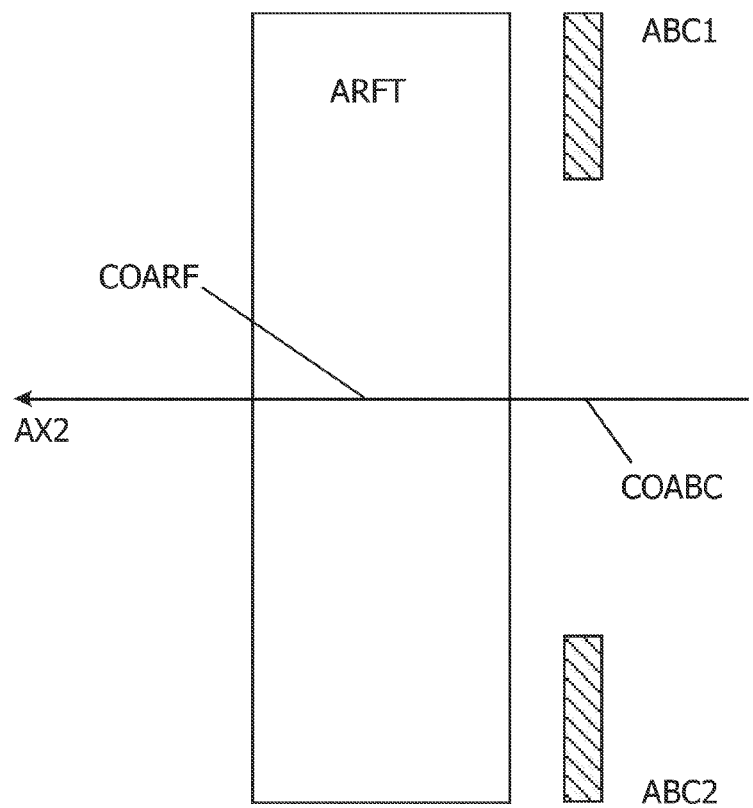
Figure 8:
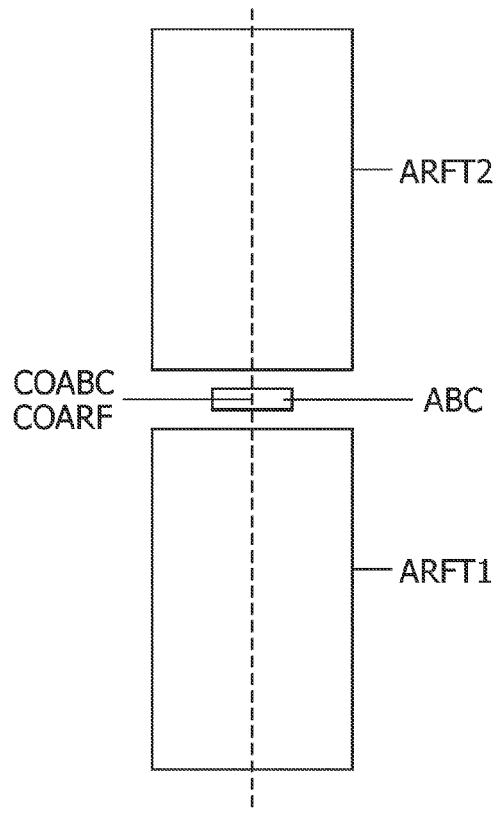
Figure 9:
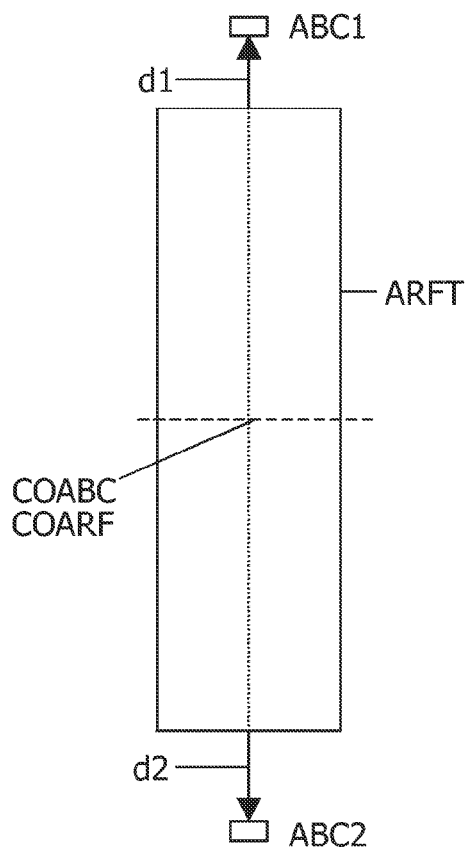
Figure 17:
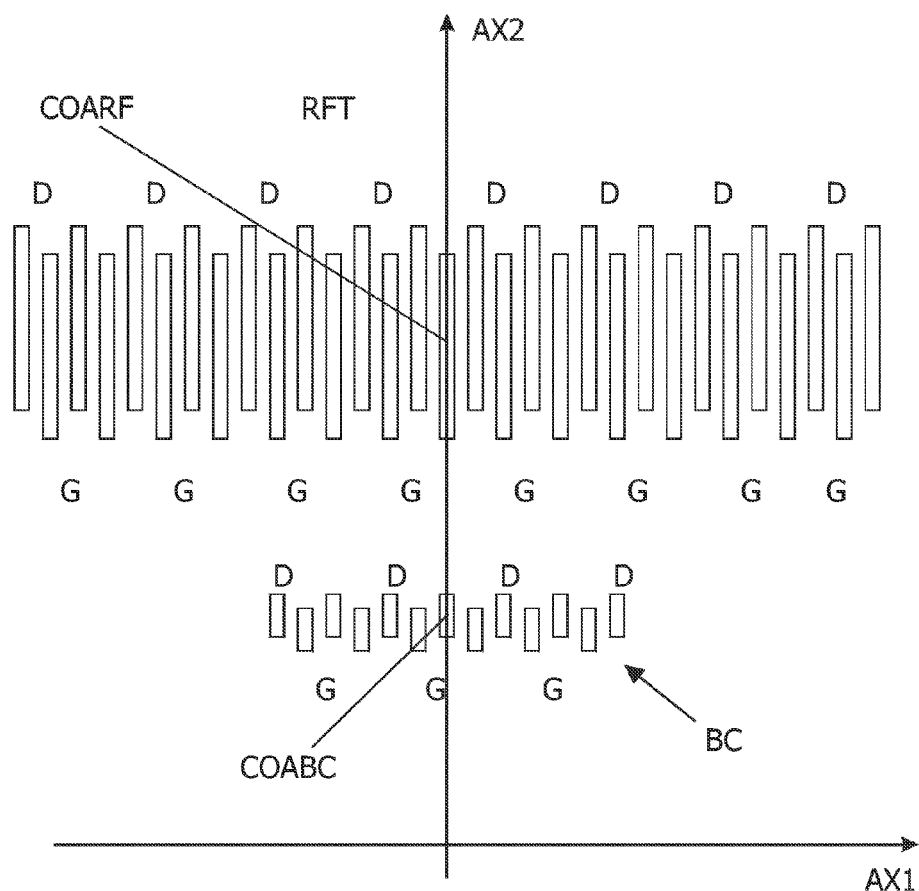

FIG. 17 shows an improved arrangement of the RF-transistor RFT and the bias cell BC compared to FIG. 16. According to this embodiment of the invention, the finger length (the width W of the MOSFET) of the bias cell (and/or the RF-transistor) is reduced, thus allowing to split the transistor in a plurality of smaller parts. Accordingly, the bias cell BC (i.e. the transistor, which the bias cell BC includes) benefits from an improved averaging effect compared to FIG. 16. All fingers (channels) have the same orientation, i.e. the fingers of the RF-transistor and the fingers of the channels of the bias cell are oriented perpendicular to AX1. Additionally, as already explained with respect to FIG. 6 and FIG. 7, the bias cell active area ABC and the RF-transistor active area ARFT should be arranged according to a principle of common centroid, such that the centres of area COARFT and COABC coincide at least on the common symmetrical axis AX2. This arrangement compensates for parameter spread in the direction AX1, being the most critical direction.

Figure 18:
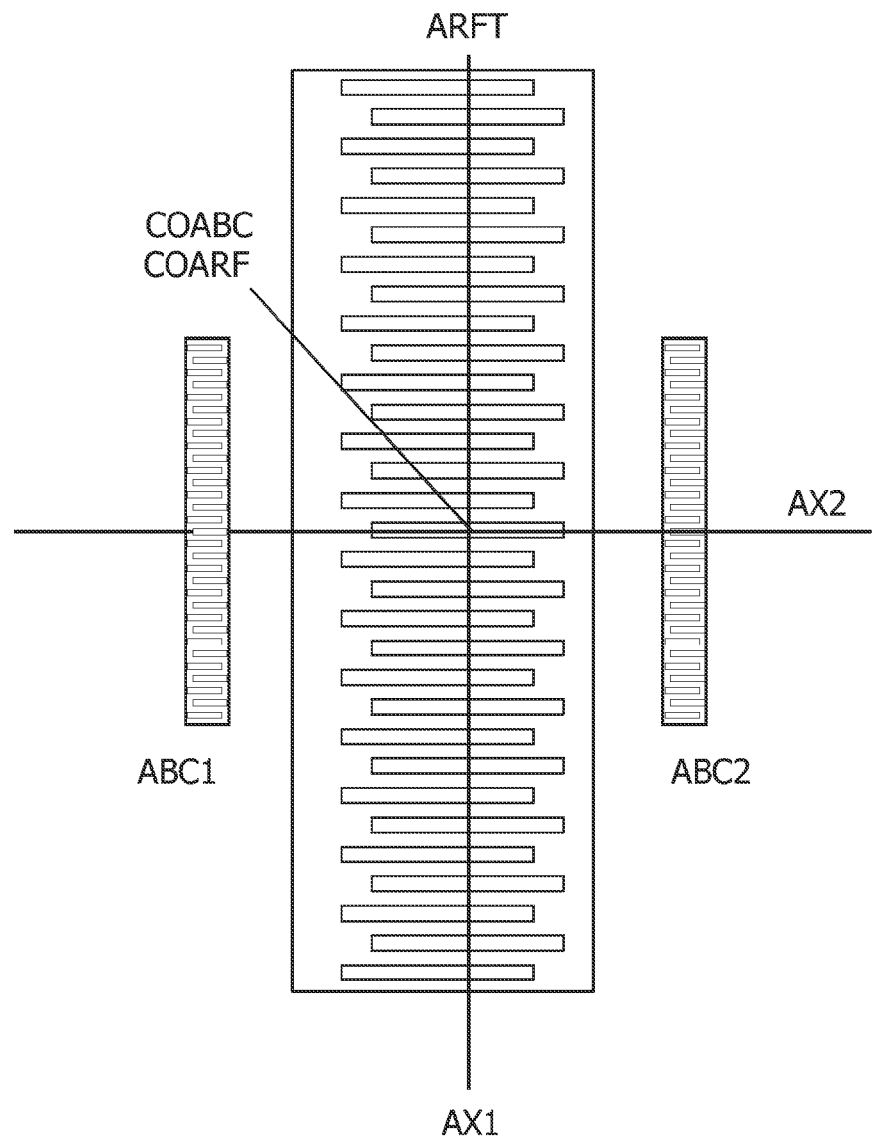

FIG. 18 shows an arrangement according to the present invention, where the total bias cell active area ABC is divided into two sub-areas ABC1 and ABC2. Both sub-areas ABC1, ABC2 have the reduced finger length as explained with respect to FIG. 17. Therefore, the bias cell BC has an improved averaging effect in the direction AX1 on the chip surface. In the same manner as shown in FIG. 17, all fingers (RF-transistor and bias cell) have the same orientation. However, according to FIG. 18, the centres of area the RF-transistor active areas COARFT and the bias cell active areas COABC coincide completely in the middle of FIG. 18. This arrangement makes an additional contribution to parameter variations in the direction of the axis AX2.

Figure 10:
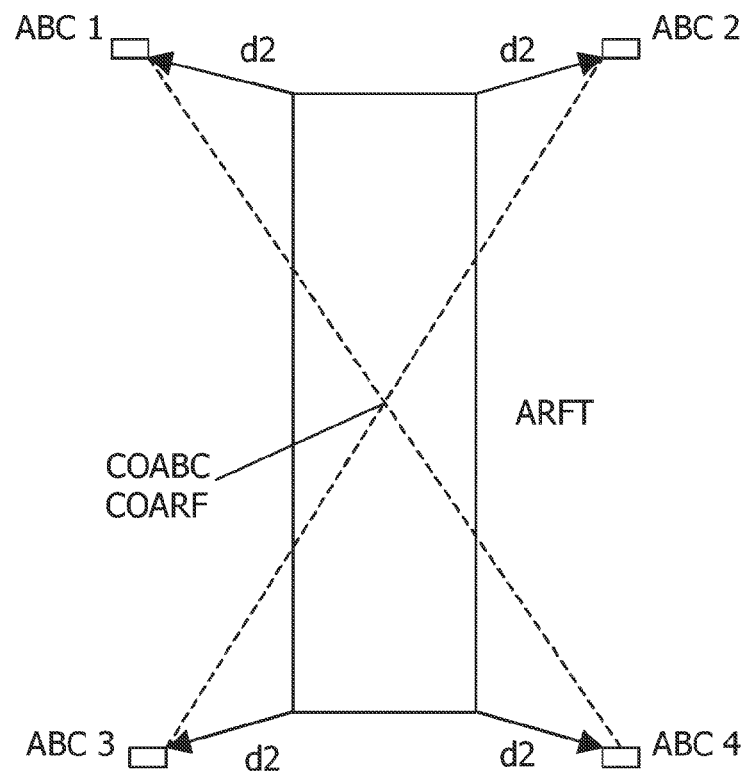
Figure 11:
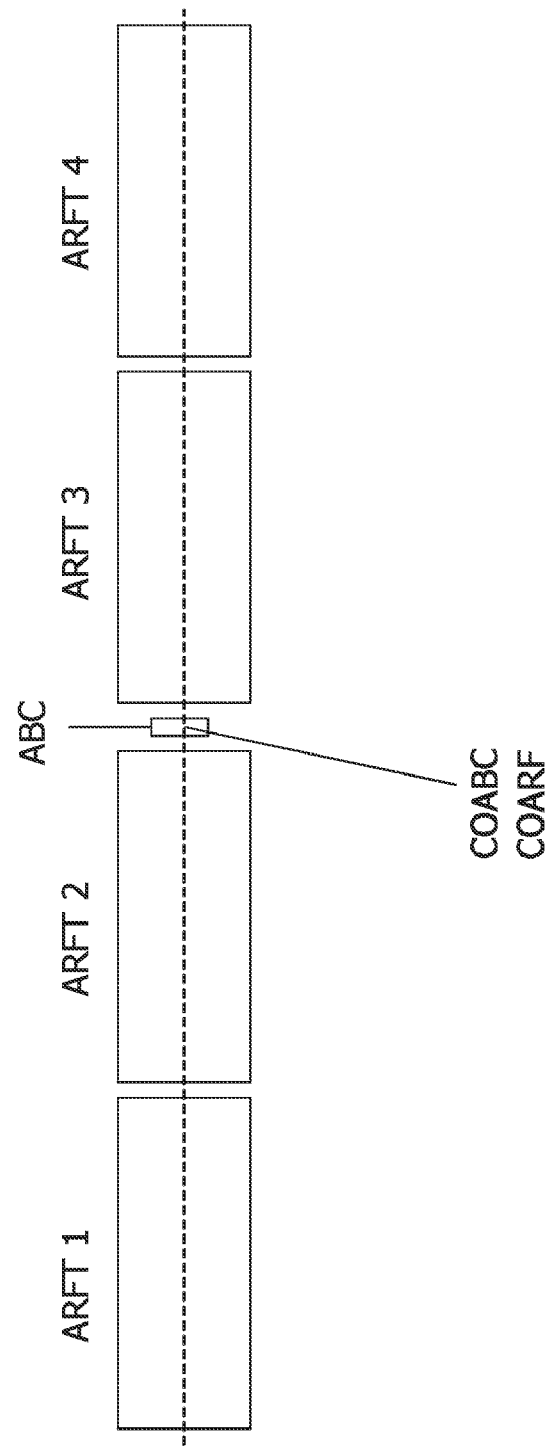
Figure 12:
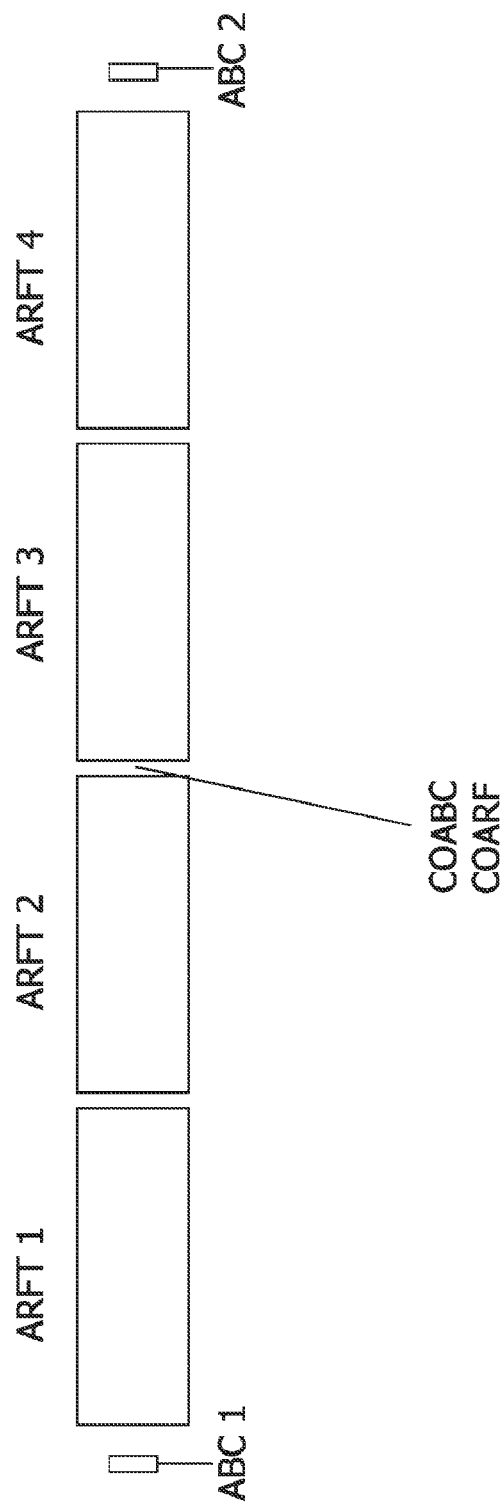
FIG. 12 shows an arrangement according to the invention with four RF-transistor active sub-areas ARFT1, ARFT2, ARFT3, ARFT4 and two bias cell active sub-areas ABC1, ABC2. Compared to FIG. 11 this arrangement has reduced thermal coupling.
Figure 13:
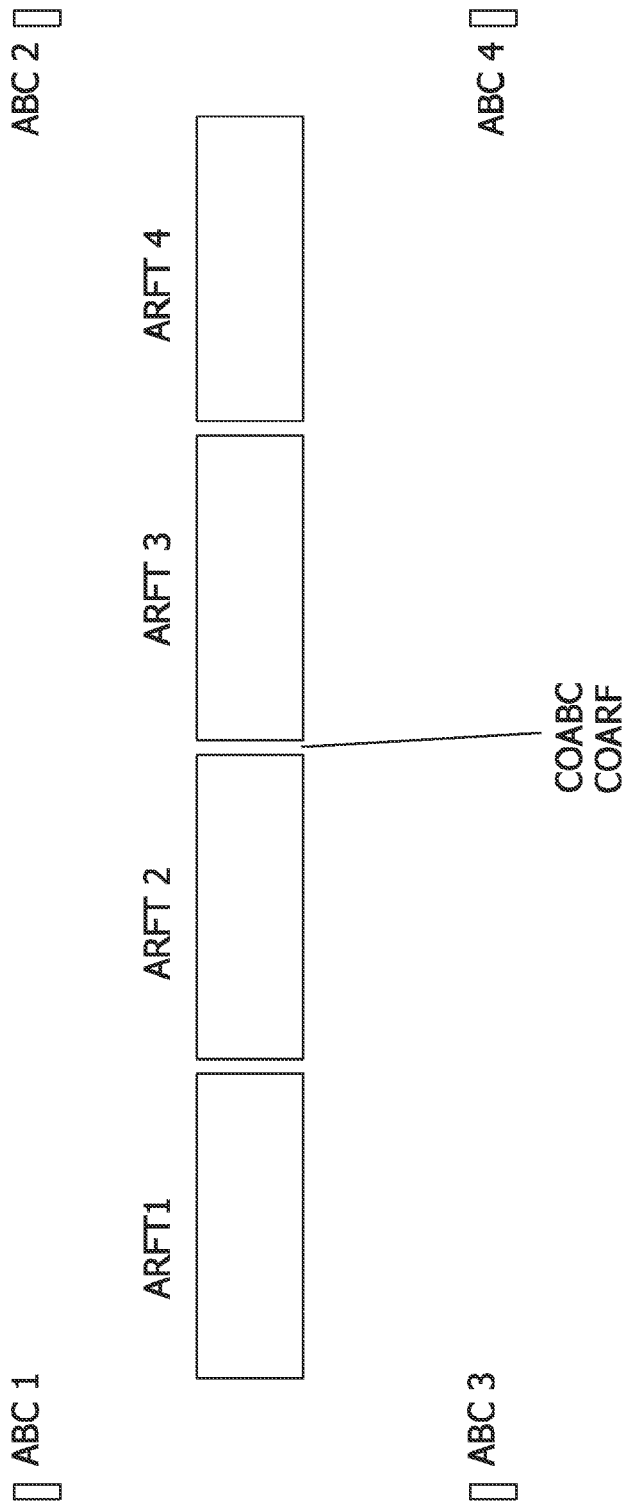
FIG. 13 shows the arrangement where four bias cell active sub-areas ABC1, ABC2, ABC3, ABC4 are arranged around the RF-transistor which is split into four active sub-areas ARFT1, ARFT2, ARFT3, ARFT4. This arrangement can serve for extremely low thermal coupling.
Figure 19:
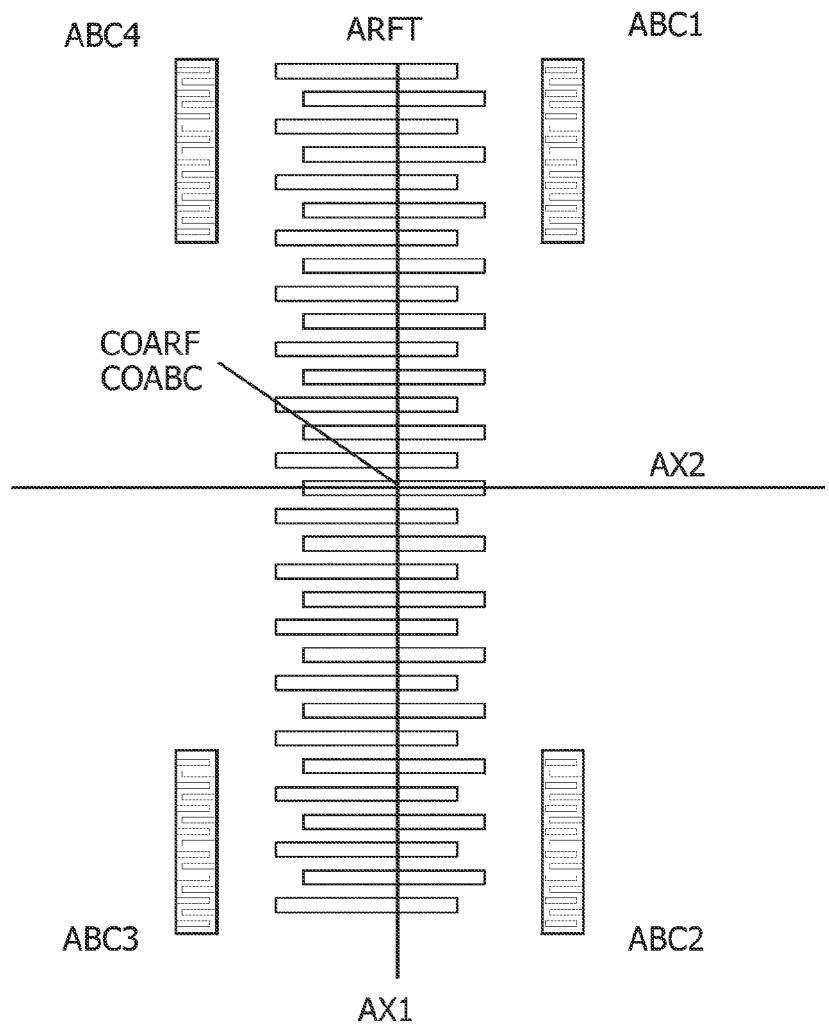

FIG. 19 shows an arrangement substantially similar to the arrangements of FIGS. 10 and 13. Four sub-areas ABC1-ABC4 of the bias cell active area ABC are provided. However, FIG. 19 shows in addition to the previously described embodiments, how to orient the channels (fingers). This should be done in accordance with the explanations given with respect to FIGS. 17 and 18. of the MOSFETS according to the explanations. Although the alignment of the centres of area with respect to the axis AX2 is shown, it is apparent for a skilled person that for short finger lengths compensation in the direction of AX2 may become more and more important.

The present invention is explained with respect to current mirrors as bias circuitry, but the skilled person is aware of other circuitries for the purposes of biasing for which the gist of the present invention would also be beneficial, and which are therefore considered within in the scope of the present invention.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim in numerating several means, several of these means can be embodied by one and the same item of hardware. The mere fact that certain measures are resided in mutually different dependent claims does not indicate that a combination of these measures cannot be used to advantage.

Furthermore, any reference signs in the claims shall not be constitute as limiting the scope of the claims.

The invention claimed is:

1. Electronic device having a semiconductor die comprising: at least one RF-transistor occupying a total RF-transistor active area on the die, the total RF-transistor active area including at least one transistor channel having a channel width and a channel length, and at least one bias cell for biasing the RF-transistor, the total bias cell having an active area including at least another transistor channel having another channel width and another channel length, the at least one bias cell occupying a total bias cell active area on the die; the total RF-transistor active area being substantially greater than the total bias cell active area, the total bias cell active area having a common centre of area, the total RF-transistor active area having a common centre of area, the active areas being arranged such that both, the common centre of area or sub-areas of the RF-transistor and the common centre of area or sub-areas of the bias cell are positioned on an axis, the axis being substantially perpendicular or parallel to the length of the at least one channel of the RF-transistor.

2. Electronic device according to claim 1, characterized by at least one of the total RF-transistor active area and the total bias cell active area being divided in at least two active sub-areas.

3. Electronic device according to claim 1, characterized by an even number of RF-transistor active sub-areas.

4. Electronic device according to claim 3, characterized by the bias cell active area being located between the RF-transistor active sub-areas, and the bias cell active area having half of the RF-transistor active sub-areas on opposite sides.

5. Electronic device according to claim 2, characterized by an even number of bias cell active sub-areas.

6. Electronic device according to claim 5, characterized by four bias cell active sub-areas, the RF-transistor active area having a rectangular shape, the four bias cell active areas being each arranged in the proximity of one of the four corners of the rectangular RF-transistor active area.

7. Electronic device according to claim 5, characterized by two equally sized bias cell active sub-areas, the two parts of the bias cell active area being arranged symmetrically on opposite sides of the RF-transistor active area.

8. Electronic device according to claim 2, characterized in that the active areas or sub-areas being arranged such that both, the common centre of area or sub-areas of the RF-transistor and the common centre of area or sub-areas of the bias cell are positioned on an axis, the axis being substantially perpendicular to the length of the at least one channel of the RF-transistor.

9. Electronic device according to claim 8, characterized each of the RF-transistor active sub-areas comprising a plurality of channels.

10. Electronic device according to claim 8, characterized by each of the bias cell active sub-areas comprising a plurality of channels.

11. Electronic device according to claim 9, characterized by all channels being aligned in parallel.

12. Method for designing an electronic device according to claim 1, comprising the steps of: selecting at least one RF-transistor occupying a total RF-transistor active area on the die, the total RF-transistor active area including at least one transistor channel having a channel width and a channel length, and selecting at least one bias cell for biasing the RF-transistor, the total bias cell active area including at least one transistor channel having a channel width and a channel length, the at least one bias cell occupying a total bias cell active area on the die; the total RF-transistor active area being substantially greater than the total bias cell active area, determining a common centre of area of the total bias cell active area-O-BC), determining a common centre of area of the total RF-transistor active area, arranging the active areas such that both, the common centre of area or sub-areas of the RF-transistor and the common centre of area or sub-areas of the bias cell are positioned on an axis, the axis being substantially perpendicular or parallel to the length of the at least one channel of the RF-transistor.

* * * * *